United States Patent [19]

Fisanick et al.

[11] Patent Number: 4,636,403

[45] Date of Patent: Jan. 13, 1987

[54] METHOD OF REPAIRING A DEFECTIVE PHOTOMASK

[75] Inventors: Georgia J. Fisanick, Warren Township, Somerset County; Michal E. Gross, Summit; Gary L. Wolk, Ewing Township, Mercer County, all of N.J.

[73] Assignees: AT&T Technologies, Inc., Berkeley Heights; Bell Telephone Laboratories, Murray Hill, both of N.J.

[21] Appl. No.: 728,551

[22] Filed: Apr. 29, 1985

[51] Int. Cl.<sup>4</sup> .................. B05D 3/06; B32B 35/00
[52] U.S. Cl. .................. 427/53.1; 427/140; 427/142; 430/5; 430/945
[58] Field of Search .................. 427/53.1, 140, 142; 430/945

[56] References Cited

U.S. PATENT DOCUMENTS

| | | | |
|---|---|---|---|
| 2,490,399 | 12/1949 | Ballard | 260/79.7 |
| 2,984,575 | 5/1961 | Fitch | 106/1 |
| 4,190,759 | 2/1980 | Hongo et al. | 219/121 LM |
| 4,220,510 | 9/1980 | Brueck et al. | 204/157.1 R |
| 4,256,778 | 3/1981 | Mizukami et al. | 427/10 |
| 4,340,617 | 7/1982 | Deutsch et al. | 427/53.1 |
| 4,340,654 | 7/1982 | Campi | 430/5 |
| 4,444,801 | 4/1984 | Hongo et al. | 427/10 |
| 4,463,073 | 7/1984 | Miyauchi et al. | 430/5 |
| 4,510,222 | 4/1985 | Okunaka et al. | 430/5 |

OTHER PUBLICATIONS

Article entitled "How to Apply Noble Metals to Ceramics", R. T. Hopper, Ceramics Industry, Jun. 1963.

*Primary Examiner*—Thurman K. Page
*Attorney, Agent, or Firm*—D. J. Kirk

[57] ABSTRACT

A process of laser-induced metal deposition for repairing transparent defects (18) in patterned metal films (14) of photomasks (10). The process comprises the steps of (a) coating the surface (16) of the substrate (12) having the film (14) thereon with a layer of metal-organic compound (50); (b) exposing the portions of the layer of metal-organic compound (50) overlying the defects (18) to a beam (24) of electromagnetic radiation from a laser (22); (c) ramping the power level of the radiation beam (24) delivered by the laser (22) until a metal patch (52) is reflective and adherent is formed; and (d) removing the unexposed portions of metal-organic compound (50) remaining on the substrate surface (16).

15 Claims, 6 Drawing Figures

U.S. Patent  Jan. 13, 1987  4,636,403
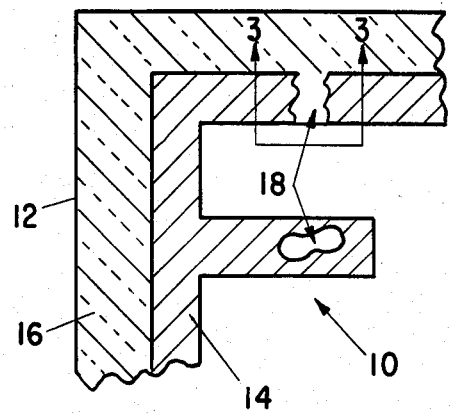
Figure 1
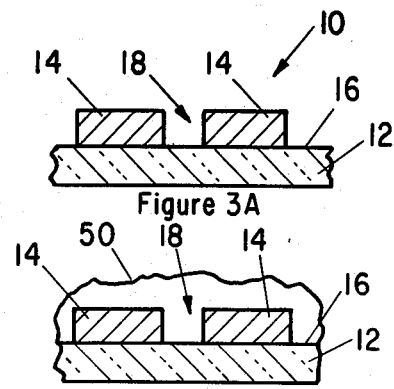
Figure 3A
Figure 3B
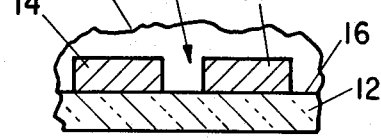
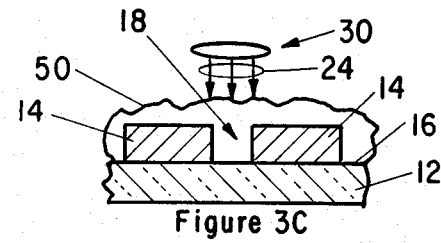
Figure 3C
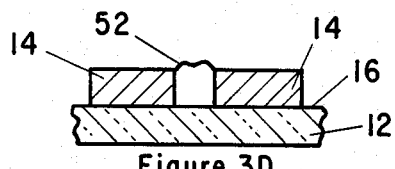
Figure 3D
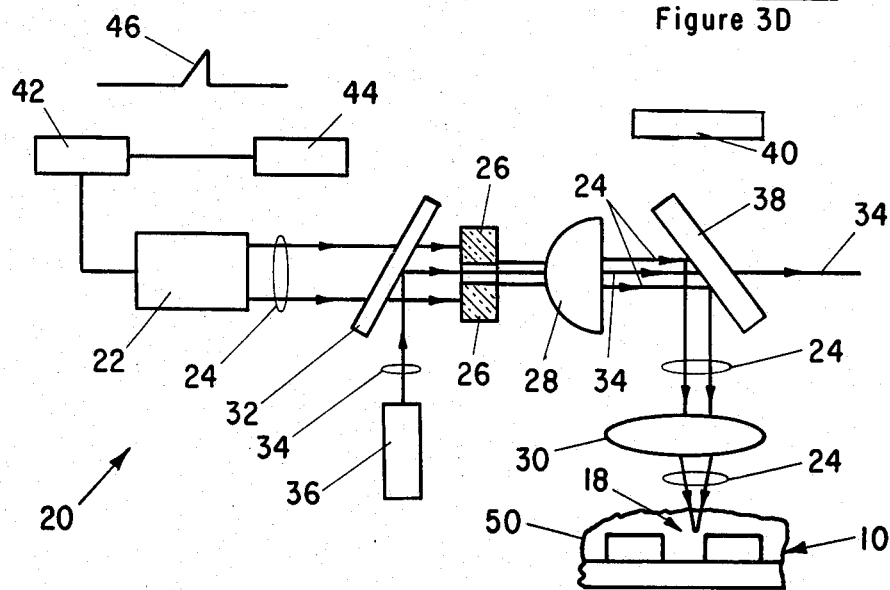
Figure 2

METHOD OF REPAIRING A DEFECTIVE PHOTOMASK

TECHNICAL FIELD

This invention relates to a method of depositing an opaque film on a substrate. More particularly, the present invention relates to a method for repairing a transparent defect in a photomask pattern.

BACKGROUND OF THE INVENTION

Photomasks are used in photolithographic processes to form circuit patterns for integrated/printed circuits. As part of the photolithographic process, a photomask is used to image a two dimensional pattern corresponding to the circuit design on a substrate surface coated with a light-sensitive photoresist material. The imaging is accomplished by selectively exposing the photoresist to light directed through transparent areas in the photomask placed in contact with or in closely spaced relation to the substrate.

After the photoresist has been selectively exposed to light, a solvent may be used to remove portions thereof to expose the substrate therethrough. The exposed areas of the substrate surface may then be doped, etched or have materials deposited thereon. Once such processing has been completed the remaining photoresist is then removed by well known techniques.

Typically, a photomask comprises a patterned metal film such as chromium, nickel or aluminum having a thickness in the order of 500 to 1000 A. deposited on a transparent base such as quartz or glass having a thickness of 0.06 to 0.09 inch. The photomask is typically manufactured by depositing a thin film of the metal on the entire surface of the transparent substrate. The film of metal is then coated with a photoresist which is sequentially exposed, developed and the metal selectively removed in the exposed areas by etching, leaving a predetermined pattern of metal film on the substrate.

In the manufacture of photomasks, transparent defects such as pin holes or missing portions of metal film may occur. These defects, in turn, cause defective integrated circuits or other devices produced when using such masks. Since the manufacture of photomasks is generally a time consuming and relatively expensive operation, it is often desirable to repair a defective photomask rather than to discard it.

At present, a lift-off method frequently is used for repairing transparent defects on the photomask. This method is similar to the method of manufacturing the original photomask. The lift-off method includes the following steps: (1) applying a photoresist to the entire patterned surface of a photomask which includes the transparent defects; (2) exposing only the photoresist areas corresponding to the underlying transparent defects to light using a partial exposure method; (3) developing and removing the photoresist at the transparent defect areas in order to reveal the underlying defects; (4) forming a metallic film over the entire surface of the photomask including the transparent defects; (5) removing the photoresist and, at the same time, removing the metallic film formed thereon while (6) leaving the metallic film formed over the transparent defects.

There are several disadvantages with using this method. First, the photoresist which is applied in the first step may itself develop pin holes thus causing the metallic film, applied in step (4), to be deposited in areas other than the patterned regions. This creates what is known as opaque defects on the transparent substrate which then need to be corrected. Secondly, the metallic film which is deposited in the defect portions of the pattern may come off during lift-off, i.e., step (5). Finally, such a technique requires many steps and is time consuming.

Another method for repairing transparent defects is described in U.S. Pat. No. 4,340,654 which issued on July 20, 1982. This method utilizes laser-induced fusing of an opaque coating material to the photomask substrate surface at the location of the transparent defect. Undesirably, fusion causes physical and optical damage of the substrate and the deposited coating material. Should too large an area, or the wrong area, of the photomask substrate be exposed, it would be impossible to correct the newly formed opaque area with standard repair techniques since the underlying substrate is now damaged or removed.

Another method for repairing transparent defects on a photomask is described in U.S. Pat. No. 4,444,801 which issued on Apr. 24, 1984. This method utilizes laser-induced metal deposition and provides that a metal-organic complex solution be applied either to the entire surface of the photomask having transparent defects or only to the transparent defect portion and its periphery. Each transparent defect is then exposed to visible rays or ultraviolet rays so as to deposit the metal or a composition thereof into the transparent defect thereby correcting the defect on the photomask pattern. The exposure is halted or terminated when the deposition has been completed.

Experimentation demonstrates that mere exposure to a laser pulse of a metal-organic material that absorbs the radiation, converting it to thermal energy, and undergoes exothermic decomposition can result in an uncontrolled reaction producing an irregular temperature rise. This reaction is caused by conversion of the laser radiation to thermal energy. The energy released from the decomposition of the metal-organic material combined with the energy delivered by the laser results in irregular depositions. The subsequent temperature rise is so abrupt that the organic component of the material becomes charred and an undesired non-volatile, non-opaque, non-adherent residue is formed with the deposited metal.

Accordingly, there is a need for an effective transparent mask defect repair technique which provides adequate adhesion of the deposited metal without concomitant charring of the metal precursor.

SUMMARY OF THE INVENTION

The foregoing problems have been overcome by the instant method of depositing metal on a substrate by applying a metal-organic compound to the substrate; exposing the metal-organic compound to light radiation; and ramping the power level of the light radiation delivered to the metal-organic compound to cause the metal to adhere to the substrate.

In an exemplary embodiment, laser-induced metal deposition is used to repair a transparent defect in a photomask pattern. That embodiment comprises the steps of: (1) coating the defect with a layer of metal-organic compound, (2) exposing the portion of the layer of metal-organic compound overlying the opening to a beam of light radiation, (3) ramping the power level of the radiation delivered to said portion to cause the portion to become opaque and adherent, and (4) removing unexposed metal-organic material with solvents.

BRIEF DESCRIPTION OF THE DRAWING

FIG. 1 is a partial top view of a photomask having typical transparent defects;

FIG. 2 is a schematic diagram of an apparatus for repairing the transparent defects in the photomask of FIG. 1; and FIGS. 3A-3D are partial cross-sectional views of the photomask taken through 3—3 shown in FIG. 1 illustrating the transparent defect repair process steps.

DETAILED DESCRIPTION

The instant invention is described in terms of repairing transparent defects in the metallized pattern of a photomask. However, such description is for purposes of exposition and not for limitation for the instant technique can be effectively used to deposit a metallic or metal oxide film on other articles where a metal or metal oxide is adhered to a substrate such as glass, quartz, silicon or the like.

Referring to FIG. 1 there is shown a portion of a photomask 10 comprising a transparent substrate 12 such as a sheet of glass or quartz having a patterned metallic film 14 such as a layer of chromium, nickel, aluminum or the like formed on one surface 16 of the photomask 10. Typically, the patterned film 14 is approximately 500 A. to 1000 A. thick. The patterned film 14 may be formed by photolithographic means as previously described. The photomask 10 may have one or more defects, particularly, transparent-type defects 18—18 which are essentially breaks or holes in the patterned film 14. Typically, the defects 18—18 are from 5 to 10 micrometers in diameter. However, defects as small as 0.5 to 1.0 micrometers as well as larger defects are not unusual.

FIG. 2 shows an apparatus 20 for correcting a transparent defect 18 on the photomask 10 which implements the method of the present invention. In an exemplary embodiment a continuous wave argon ion laser 22 (e.g., Spectra-Physics, Inc. of Mountainview, Calif., model 171-19) outputs a beam 24 of light energy having a wavelength of 5145 A. The laser beam 24 passes through a variable rectangular aperture 26 which directs the laser beam 24 to a lens 28. The purpose of the lens 28 is to focus the diffraction pattern of the beam 24 caused by the aperture 26 onto the back focal plane of a microscope objective 30.

Prior to passing through the aperture 26, the beam 24 passes through a first dichroic mirror 32 which reflects a white light 34 from a source 36 into a path coaxial with the beam 24. The laser beam 24 travels coaxially with the white light 34 through the lens 28 to a second dichroic mirror 38. The second dichroic mirror 38 reflects the laser beam 24 onto the objective 30 along with the white light 34. The objective 30 condenses and projects the laser beam 24 and the white light 34 to a defect portion 18 of the photomask 10. The white light 34 is used for purposes of adjusting the apparatus 20 so that the beam 24 will be directed toward the defect 8 upon actuation of the laser 22. Note that a surveillance device 40 is positioned above the mirror 38 in order to observe the photomask 10 during the repair process.

The laser 22 is connected to an external light control 42 which allows control of the laser power level. The light control 42 is powered by a voltage pulse generator 44. The generator 44 outputs a sawtooth or other ramp type signal 46 whose peak voltage determines the final peak output power of the laser 22. In the exemplary embodiment, a 2.5 volt signal yielded a 20 watt laser beam when the exemplary laser 22, described above, is configured for maximum output power.

FIGS. 3A-3D illustrate the method of correcting a transparent defect 18 on the photomask 10 by use of the defect correcting apparatus 20 shown in FIG. 2. A portion of a photomask 10 with a typical transparent defect 18 in its patterned film 14 is shown in FIG. 3A. In the first step of the method of the present invention (FIG. 3B), a metal-organic gold screen ink 50 is applied, via spin-coating, over the entire surface 16 of the substrate 12 to a thickness of approximately two micrometers. For a typical 4 inch by 4 inch photomask 10, approximately two grams of material 50 are spun onto the surface 16 at a speed of 3000 revolutions per minute for 60 seconds. The material 50 can also be applied by spraying or brushing such that it is applied selectively to the transparent defect 18 and the nearby surrounding area. The coated photomask 10 is then typically dried for twenty (20) minutes at 90° C. to remove volatile organic solvents from the metal-organic ink 50.

After drying, the photomask 10 is presented to the defect correcting apparatus 20 shown in FIG. 2 and positioned so the laser beam 24 will project onto the material 50 overlying the transparent defect 18. An operator accomplishes this by adjusting the aperture 26 so the white light 34 registers with the image of the defect 18 as viewed through the device 40. The operator then causes the voltage generator 44 to output a ramp signal 46 to the external light control 42 which actuates the laser 22. The output power of the laser 22 ramps up in concert with the output voltage of the generator 44. The beam 24 travels through the objective 30 to condense and project upon the volume of metal-organic material 50 associated with the defect 18 (FIG. 3C). The output power of the laser 42 continues to increase with increasing ramp voltage until the ramp signal 46 reaches a peak and then decreases to zero volts.

The aforementioned method of ramping the output power of the laser 42 is one of several methods that may be utilized. Other ramping methods used by those skilled in the art include but are not limited to rotating polarizers, electro-optic or acoustic-optic methods and graded attenuators which are moved through the laser beam 24 during a predetermined period of time. Regardless of the method, within approximately one second of laser beam exposure, a reflective patch 52 of metal film is formed or deposited within the defect 18 so as to repair the patterned film 14 (FIG. 3D). The adhesion of the metal patch 52 occurs between approximately one and three seconds. It should be noted that the metal adheres to the substrate and does not fuse with substrate materials. Once properly exposed, the substrate is cleaned with an appropriate solvent to remove unexposed portions of the metal-organic material 50.

The laser power required to deposit an opaque, adherent metal patch 52 is dependent on the material 50, the material of the substrate 12 and the efficiency of the optical train (i.e., the lens 28, the objective 30 and the dichroic mirrors 32 and 38).

Generally, the criteria for an optimal metal-organic material 50 for metal deposition by laser-induced decomposition are that (1) it forms homogeneous films which are adherent to the substrate, (2) it has a high metal content, (3) it exhibits a low temperature threshold for decomposition, (4) it achieves a complete decomposition and vaporization of organic material, and (5) it decomposes with a neutral or endothermic overall heat of reaction. The use of the method of the present invention eliminates the fifth criterion and, thereby, expands the class of viable metal-organic materials 50 by permitting use of a metal-organic material that undergoes exothermic decomposition. The present method also insures that the fourth criterion is met by describing steps that could be used by metal-organic materials 50.

The gold screen ink (15 weight percent gold) is comprised of a gold terpene mercaptide. Basically, it is a metal-organic compound in solution with a polymer-forming compound. In particular, it is a mixture of gold chloride reacted with sulfurized terpenes, to which resin binders, essential oils, and base metal brightening and adhesion agents have been added. The gold screen ink is more fully described in U.S. Pat. No. 2,490,399 by K. H. Ballard and U.S. Pat. No. 2,984,575 by H. W. Fitch which are incorporated by reference herein. A commercially available metal-organic material 50 which undergoes exothermic decomposition is Engelhard bright gold A3728 screen ink manufactured by Engelhard of East Newark, N.J. Additionally, an article titled "How to Apply Noble Metals to Ceramics" by R. T. Hopper in CERAMIC INDUSTRY dated June 1963 is also incorporated by reference herein.

For the exemplary material 50 described above and an optical train having (1) a 20 cm (f/8) fused silica lens 28,
(2) a 99% dielectric mirror 38, and
(3) a 40× (N.A. 0.65) microscope objective 30, an opaque, adherent rectangular metal patch 52 of dimensions 7 micrometers×7 micrometers may be formed on a White Crown glass substrate 12 using a peak laser power of 500 milliwatts and a ramping time of 1 to 10 seconds. The shortest ramping time used (i.e., 1 second) yielded rectangular patches 52 which are 10% smaller than the optical spot size (i.e., the condensed laser beam 24 dimensions) while utilizing the longer ramping periods (i.e., 7.5 to 10 seconds) yields rounded patches 52 which are 50% larger than the optical spot size. The ramp, or increase in power, is continuous and may be linear with time. However, other increasing continuous non-linear ramps may be used. Note that ramping periods less than 1 second have the same undesirable effect as pulses. At a ramping time of 2-5 seconds, the deposited patch 52 is rectangular and is within 5% of the optical spot dimensions.

For substrates 12 which have greater thermal conductivities (i.e., quartz), the laser output power must be increased in proportion to the thermal conductivity in order to obtain adhesive patches 52 (i.e., approximately 700 milliwatts in 2 seconds yields the same quality patch 52 on a quartz substrate as does 500 milliwatts for 2 seconds with a White Crown glass substrate). The required power to obtain adherent patches 52 on quartz substrates 12 has been found to be 3.0 milliwatts per micron on target (i.e., power required is proportional to the square root of the optical spot area).

A probe of an exothermic decomposition of the gold screen ink shows why it is necessary to ramp up the laser output power rather than merely exposing such a metal-organic material 50 to a pulsed laser beam. It was found that the gold screen ink decomposes in two steps, an endothermic step at a lower temperature $T_1$ and an exothermic step at a higher temperature $T_2$ corresponding to pyrolysis of the remaining organic components of the ink. Thus, the overall heat of reaction is highly exothermic. If the laser power raises the ink temperature rapidly (i.e., as in a pulsed laser), the heat released in the highly exothermic polymer decomposition combines with the laser output energy to produce an uncontrolled thermal reaction and an associated abrupt temperature rise. The extremely rapid temperature rise obtained in the pulsed laser system yields incomplete decomposition of the ink, resulting in undesired carbon contamination of the deposited gold.

A probable reaction scheme is as follows: At some initial temperature $T_1$, the gold metal-organic component of the screen ink begins to decompose, and essential oils in the ink are vaporized in an endothermic process. As the temperature is increased still further to $T_2$, the remaining organic species decompose via oxidation reactions in an exothermic process, producing relatively small volatile products from the organic portions of the gold screen ink and leaving behind, in the form of a patch of film, the metal component.

If the temperature rise in the ink is too abrupt, the reaction in the first steps of the process will not have proceeded to completion, implying that large organic entities (oligomeric units) must be oxidized in the final high temperature step. Since the oxidation products of these large molecular entities are non-volatile, they will remain on the substrate surface 16, contaminating the metal film patch 52. An additional difficulty caused by too rapid a temperature rise is that the polymeric material 50 will flow away from the laser-irradiated area (i.e., the transparent defect 18), leaving voids or very thin (optically transparent) metal films in parts of the laser-irradiated area, and a reacted film which is substantially larger than the illuminated region.

The local rates of the different reaction steps are a strong function of the rate of heat release from the exothermic reactions in the nearby material and the rate of energy deposition from the laser beam (as well as other exposure parameters such as the film thickness). The present method controls the rate of heat release from the reaction by gradually increasing (i.e., ramping) the power of the laser beam 24 over time. In effect, the instant method controls exposure so that the intermediate reactions can proceed for a long enough time period to allow the ink to degrade into simpler organic entities (monomers) before oxidation takes place at the higher temperature $T_2$ with the resulting formation of the volatile oxidation products and the metal film patch 52. The volatile products are soon thereafter vaporized by the laser beam 24.

Note that the contact between the deposited metal patch 52 (e.g., gold) and the substrate surface 16 is sufficiently adhesive so as not to require the addition of any additional compound to the metal-organic material 50 when the substrate surface 16 is mainly chromium. In the case where the substrate surface 16 is substantially a glass, the base metal content of the gold screen ink is increased by the addition of Engelhard titanium base metal resinate solution #9428 (7.2% titanium by weight) so that the gold screen ink is 92% by weight of the entire material 50 and the titanium resinate is 8% by weight. Furthermore, because of the strong adhesive characteristics achieved by the steps of the present method, no transparent protective shield need be applied over the patterned surface 16 of the photomask 10 before chemical scrubbing and washing. Thus the contact between the substrate surface 16 and the deposited metal patch 52 in the transparent defect 18 has a higher bonding strength than that of previous methods.

It is to be understood that the embodiments described herein are merely illustrative of the principles of the invention. Various modifications may be made thereto by persons skilled in the art without departing from the spirit and scope of the invention.

For example, the exemplary embodiment uses a metal-organic material 50 which undergoes exothermic decomposition; however, it should be clear that the steps of the present method can utilize any metal-organic material 50 regardless of its heat of reaction characteristics.

Additionally, although the wavelength of the laser beam 24 is set forth as 5145 Angstrom units for the exemplary metal-organic material 50 (i.e., Englehard bright gold A3728 screen ink) it is not so limited. The wavelength will always be a function of the particular material 50 used in the repair process and can therefore take on a range of values.

Although the disclosed embodiment of the invention is directed to the repair of transparent defects it is also contemplated that patterns of metal or metal oxides can be deposited on a substrate (e.g., glass, quartz, silicon or the like) by directing light through appropriately patterned masks.

What is claimed is:

1. A method of depositing metal on a substrate, comprising the steps of
   (a) applying a metal-organic compound to a substrate;
   (b) exposing the metal-organic compound to light radiation; and
   (c) ramping the power level of the light radiation delivered to the metal-organic compound to cause said compound to decompose to volatile components and a metal film which is adherent to the substrate.

2. A method of repairing an opening in an opaque film on a substrate, comprising the steps of:
   (a) coating the opening with a layer of metal-organic compound;
   (b) exposing the portion of the layer of metal-organic compound overlying the opening to a beam of light radiation; and
   (c) ramping the power level of the light radiation delivered to said portion to cause the portion to become opaque and adherent to the substrate.

3. The method as set forth in claim 2 wherein the step of ramping comprises gradually increasing the power level of the radiation delivered to the portion to cause metal from the metal-organic compound to be deposited within the opening until the metal is completely opaque and adherent.

4. The method as set forth in claim 2 wherein the metal-organic compound decomposes with an exothermic overall heat of reaction.

5. The method as set forth in claim 2 wherein the step of ramping is characterized by ramping the power level to 50 square microns of the compound from 0 milliwatts to 15 milliwatts over a time period of 5 seconds when the substrate is a crown or borosilicate glass.

6. The method as set forth in claim 2 wherein the step of ramping is characterized by increasing the power level to 50 square microns of the compound from 0 milliwatts to 25 milliwatts over a time period of 5 seconds when the substrate is a fused quartz or fused silica.

7. The method as disclosed in claim 2 wherein the wavelength of the light radiation is 5145 Angstrom units.

8. A method of repairing a transparent defect in a thin film photomask pattern comprising:
   (a) coating the surface of the photomask having the film thereon with a layer of metal-organic compound which decomposes with an exothermic overall heat of reaction;
   (b) exposing the portion of the layer of metal-organic compound overlying the defect to a beam of electromagnetic radiation from a laser for initiating the decomposition of the metal-organic compound;
   (c) ramping the power level of the radiation delivered by the laser so as to completely decompose the metal-organic compound whereby the organic portion is vaporized and the metal portion is deposited into the defect; and
   (d) removing the unexposed metal-organic compound remaining on the photomask surface.

9. The method as set forth in claim 8 wherein the step of ramping is characterized by ramping the power level to 50 square microns portion from 0 milliwatts to approximately 15 milliwatts over a time period of 5 seconds when the substrate is a crown or borosilicate glass.

10. The method as set forth in claim 8 wherein the step of ramping is characterized by ramping the power level to a 50 square micron portion from 0 milliwatts to approximately 25 milliwatts over a time period of 5 seconds when the substrate is a fused quartz or fused silica.

11. The method as disclosed in claim 8 wherein the wavelength of the electromagnetic radiation from the laser is 5145 Angstrom units.

12. The method as set forth in claim 8 wherein the metal-organic compound comprises a gold terpene mercaptide.

13. The method as set forth in claim 12 wherein the metal-organic compound is combined with a titanium resinate.

14. The method as set forth in claim 8, wherein the laser power delivered to a 50 square micron portion is at least 3.0 milliwatts per micron for a quartz substrate.

15. The method as set forth in claim 8, wherein the laser power delivered to a 50 square micron portion is at least 2.0 milliwatts per micron for a glass substrate.

* * * * *